United States Patent
Gerding et al.

(10) Patent No.: US 7,199,633 B2
(45) Date of Patent: Apr. 3, 2007

(54) ELECTRIC PULSE GENERATOR AND METHOD FOR GENERATING SHORT ELECTRIC PULSES

(75) Inventors: Michael Gerding, Herne (DE); Burkhard Schiek, Bochum (DE); Thomas Musch, Mülheim an der Ruhr (DE)

(73) Assignee: Krohne A.G., Basel (CH)

( * ) Notice: Subject to any disclaimer, the term of this patent is extended or adjusted under 35 U.S.C. 154(b) by 179 days.

(21) Appl. No.: 10/950,243

(22) Filed: Sep. 24, 2004

(65) Prior Publication Data

US 2005/0093601 A1    May 5, 2005

(30) Foreign Application Priority Data

Sep. 26, 2003 (DE) .................. 103 45 077
Dec. 17, 2003 (DE) .................. 103 59 441

(51) Int. Cl.
*H03K 5/04* (2006.01)
(52) U.S. Cl. ...................... 327/173; 327/291
(58) Field of Classification Search ............... 327/291, 327/299, 335, 172, 173, 178, 180, 164–167
See application file for complete search history.

(56) References Cited

U.S. PATENT DOCUMENTS

| | | | |
|---|---|---|---|
| 3,832,568 A * | 8/1974 | Wang | 307/106 |
| 4,442,362 A | 4/1984 | Rao | 307/108 |
| 4,862,863 A | 9/1989 | Komurasaki | 123/465 |
| 5,724,002 A * | 3/1998 | Hulick | 329/361 |
| 6,087,871 A * | 7/2000 | Kardo-Syssoev et al. | 327/189 |
| 6,108,376 A * | 8/2000 | Morgan et al. | 375/239 |
| 6,175,283 B1 * | 1/2001 | Fehrenbach et al. | 331/99 |
| 6,191,724 B1 * | 2/2001 | McEwan | 342/21 |

FOREIGN PATENT DOCUMENTS

| DE | 44 01 350 C1 | 6/1995 |
|---|---|---|
| EP | 0272924 A2 | 6/1988 |

OTHER PUBLICATIONS

A. Moser, Adjustable Pulse Width Single-Shot, IBM Technical Disclosure Bulletin, Oct. 1965, vol. 8 No. 5.
European Patent Office Search Report, Mar. 3, 2005, For Application No. 04021102.1-2215.

* cited by examiner

*Primary Examiner*—Timothy P. Callahan
*Assistant Examiner*—Hai L. Nguyen
(74) *Attorney, Agent, or Firm*—John F. McKenna; Cesari & McKenna, LLP

(57) ABSTRACT

A method for generating short electric pulses, comprising the steps of generating a control pulse, feeding the control pulse to a bipolar transistor, which subsequently emits an output signal with a steep switch-off side by exploiting the charge storage effect of the bipolar transistor, and differentiating the output signal with the steep switch-off side so that short primary pulses are generated. An electric pulse generator is also disclosed.

11 Claims, 2 Drawing Sheets

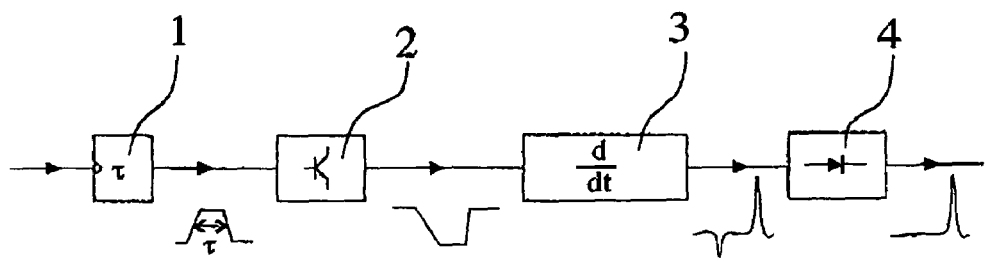
Fig. 1
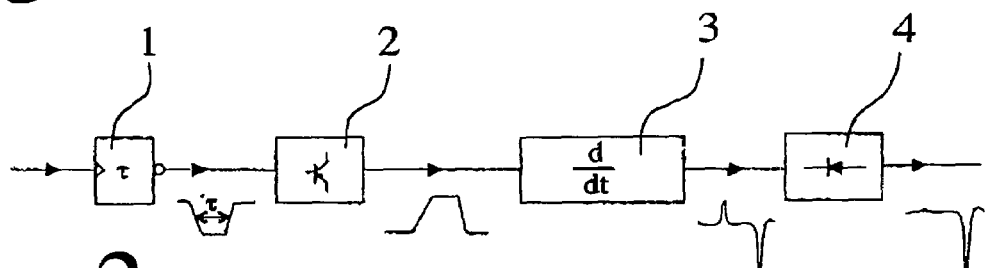
Fig. 2
Fig. 3a 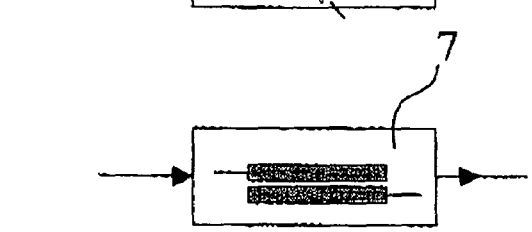 Fig. 3b 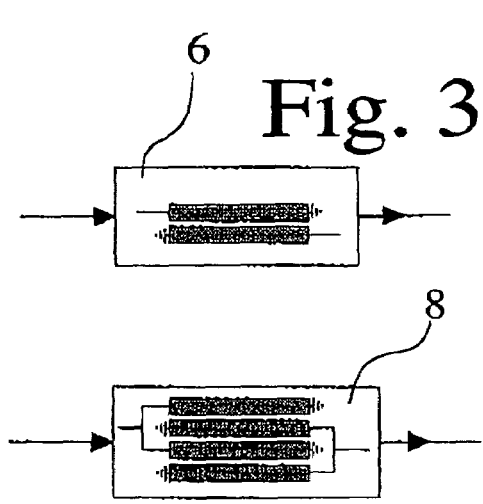
Fig. 3c
Fig. 3d Fig. 4a
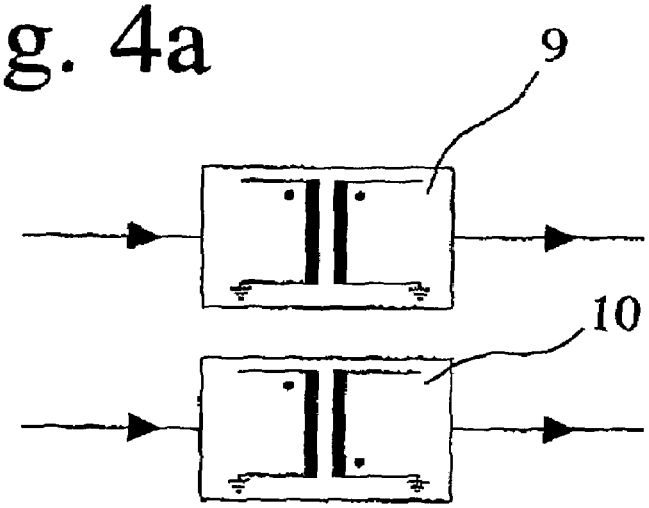
Fig. 4b
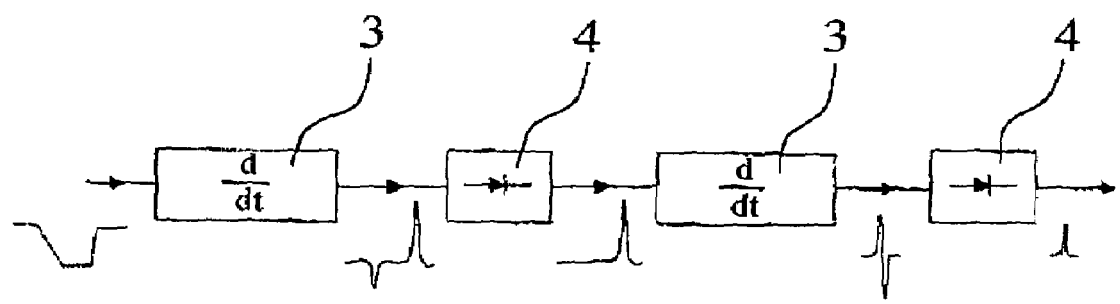
Fig. 5

ELECTRIC PULSE GENERATOR AND METHOD FOR GENERATING SHORT ELECTRIC PULSES

BACKGROUND OF THE INVENTION

The invention relates to an electric pulse generator for generating short electric pulses as well as a method for generating short electric pulses.

Familiar electric pulse generators as well as methods for generating short electric pulses are generally based on the use of so-called step recovery diodes (SRD), the rapid switch-off behavior of which is exploited among other things to generate short electric pulses. One disadvantage here is the difficult and relatively technically complex separation of the stimulating signal and the generated signal since a step recovery diode is a two-port element. Moreover the level of the selection signal must range in the order of magnitude of the desired output level since a passive step recovery diode does not allow signal amplification. Due to the few technical applications of step recover diodes they are additionally relatively difficult to procure and are accordingly expensive.

SUMMARY OF THE INVENTION

It is the object of the invention to provide an electric pulse generator as well as a method for generating short electric pulses, both being inexpensive, reliable and diverse in their use.

The electric pulse generator with which the above-described and presented object is achieved is characterized in that the following features are provided: a selection device to generate a control pulse, a transistor circuit or step with a bipolar transistor to which the control pulse is fed and which subsequently emits an output signal with a steep switch-off side by exploiting the charge storage effect of the bipolar transistor, and a differentiation circuit or device, to which the output signal with the steep switch-off side is fed and which subsequently emits short primary pulses.

When using a fast, high frequency bipolar transistor for the transistor device, short pulses having pulse widths clearly below 1 ns to below 90 ps can be achieved at amplitudes of a few volts. To be able to exploit the charge storage effect of the bipolar transistor the following should be noted:

The fast bipolar transistor, which is preferably operated in the common emitter circuit, is initially directed by means of a suitable control signal briefly into the state of saturation so that both the base emitter diode and the base collector diode become conductive. The base collector space charge region, which is flooded this way with minority carriers and is hence of low impedance, abruptly becomes high-impedance after a brief period of delay when shutting off the transistor input signal, in the present case the control pulse leading to an abrupt increase in the collector voltage. In relation to the transistor input signal generated by the selection circuit, the switch-off side of the transistor output signal is clearly steeper, wherein the polarity of the steeper switch-off side depends on the transistor type (NPN or PNP) that is used, the transistor base circuit and the corresponding polarity of the control signal.

Apart from the emitter circuit, which is preferred in this case due to the high transistor current gain, for the bipolar transistor of the transistor step also a collector circuit or a base circuit of the bipolar transistor are possible.

The previously described electric pulse generator according to the invention is generally used to generate electric pulses with bipolar parts. Frequently, however, a pulse signal with purely monopolar parts is desired so that according to a preferred embodiment of the invention, a clipping device is provided which is arranged downstream from the differentiation step and to which is fed the short primary pulses, wherein predetermined pulse portions are removed from the short primary pulses and a short pulse signal is emitted. In particular, such a clipping device may be provided which emits a monopolar short pulse signal.

For the design of the clipping device a variety of possibilities is available. Pursuant to preferred embodiments of the invention, it is, e.g., provided that a Schottky diode, preferably having a low case capacitance, which is added serially into the line, is used. Moreover, transistors, preferably HF transistors, may be used in the clipping device.

As control pulses, pulses having different pulse wave shapes may be used. Pursuant to a preferred embodiment of the invention, however, a pulse that corresponds substantially to a rectangular pulse and preferably has a pulse width in the nanosecond range is used as the control pulse.

In the differentiation device, in principle all known differentiation techniques may be applied. Pursuant to a preferred embodiment of the invention, however, it is provided that the differentiation device has a planar circuit structure, preferably in a microstrip design. The function of the differentiation device here can be expanded such that in addition to the differentiation, a phase angle rotation and hence an inversion of the input signal takes place. To this end, in particular such a planar circuit structure may be provided that leads to polarity reversal.

Pursuant to a preferred embodiment of the invention, alternatively the differentiation device may comprise a transformer circuit. In particular, it may be possible to design the transformer circuit as being counterwound, thus causing a polarity reversal.

It should be pointed out that in the transistor step especially also a heterostructure bipolar transistor may be used as the bipolar transistor.

Finally, to further shorten the emitted pulse signal, it is provided pursuant to a preferred embodiment of the invention to include a plurality of differentiation devices, which are separated by a clipping device, respectively. Through this preferred embodiment of the invention, the pulse widths can be reduced even further; however in this case, a decrease in the amplitude must be tolerated.

The method pursuant to the invention for generating short electric pulses, with which the above-described and presented object is achieved, is characterized in that a control pulse is generated, that the control pulse is fed to a bipolar transistor, which subsequently emits an output signal with a steep switch-off side by exploiting the aforementioned charge storage effect of the bipolar transistor, and that the output signal with the steep switch-off side is differentiated so that short primary pulses are generated.

Preferred embodiments of the method according to the invention are revealed in analogy with the previously described embodiments of the electric pulse generator according to the invention.

In detail, a variety of possibilities exist for designing and further developing the inventive electric pulse generator as well as the inventive method for generating short electric pulses. To this end, reference shall be made to the dependent patent claims as well as to the following detailed description of preferred embodiments of the invention while referencing the drawings.

BRIEF DESCRIPTION OF THE DRAWINGS

The drawings show:

FIG. 1 is a basic circuit diagram of an electric pulse generator that is based on an NPN bipolar transistor pursuant to a first preferred embodiment of the invention;

FIG. 2 is a basic circuit diagram of a pulse generator that is based on a PNP transistor pursuant to a second preferred embodiment of the invention;

FIGS. 3a to 3d are various planar implementation possibilities of the differentiation circuit or device pursuant to different preferred embodiments of the invention;

FIGS. 4a and 4b are various implementation possibilities of the differentiation circuit or device pursuant to different preferred embodiments of the invention, and FIG. 5 is a basic circuit diagram for the use of a plurality of differentiation circuits or devices that are separated by a clipping device, respectively, pursuant to another preferred embodiment of the invention.

DESCRIPTION OF THE PREFERRED EMBODIMENTS

FIG. 1 shows a basic circuit diagram of a pulse generator pursuant to a first preferred embodiment of the invention. The pulse generator comprises a selection device 1 for generating a control pulse, which corresponds substantially to a rectangular pulse having a pulse width $\tau$ of several nanoseconds. This control pulse is fed to a transistor circuit or device 2, which comprises an NPN bipolar transistor in the emitter circuit. The transistor circuit or device 2 is followed by a differentiation circuit or device 3, which, in turn, is followed by a clipping device 4.

It was addressed already above that the rapid bipolar transistor that is provided in the transistor circuit or device 2 in the form a three-port element is beneficial in that no further measures have to be taken for separating the input signal from the output signal, which significantly reduces the circuit complexity compared to pulse generation by means of a step recovery diode. Incidentally, it is true that apart from the collector circuit or base circuit of the bipolar transistor, which are likewise possible for the present preferred embodiment of the invention, the emitter circuit is better suited due to its transistor current gain.

To exploit the charge storage effect of the NPN bipolar transistor, said transistor is first directed for a brief period into a state of saturation so that both the base emitter diode and the base collector diode become conductive. Thus, the base collector space charge region is flooded with minority carriers and is hence of low impedance. When shutting off the transistor input signal, i.e. the control pulse coming from the selection device 1, the existing base collector space charge region of low impedance becomes abruptly high impedance again following a brief period of delay, leading to a very rapid increase in the collector voltage. In relation to the switch-off side of the control pulse entering the transistor, the switch-off side at the output of the transistor or circuit device 2 is clearly steeper.

A comparison with FIG. 2, which illustrates a basic circuit diagram of a pulse generator with a PNP transistor that complements the pulse generator described here in the transistor circuit or device 2, reveals that the polarity of the steeper switch-off side depends on the transistor type (NPN or PNP) that is used. Incidentally, the polarity of the steeper switch-off side, as already indicated above, depends on the transistor base circuit that is used and the selection of the transistor.

Pursuant to the preferred embodiments of the invention illustrated in FIGS. 1 and 2, the transistor circuit or device 2 is followed by a differentiation circuit or device 3 and a clipping circuit or device 4, respectively, the functions of which are as follows:

The differentiation circuit or device 3 is used to differentiate the output signal coming from the transistor circuit or device 2, said output signal having a steep switch-off side, so that the differentiation circuit or device 3 must primarily have high-pass character. FIGS. 3a to 3d show various implementation possibilities of the differentiation circuit or device 3 having a microstrip design according to preferred embodiments of the invention. Contrary to the networks 5 and 7 shown in FIGS. 3a and 3c, the networks 6 and 8 depicted in FIGS. 3b and 3d, in addition to the differentiation, cause a phase angle rotation of the differentiated input signal by 180°, which corresponds to polarity reversal. The networks 6, 7 and 8 of FIGS. 3b, 3c and 3d are line couplers that have been optimized for this purpose, which can be designed individually or as parallel connections of several line couplers (inter-digital coupler) depending on the desired coupling. The dimensions of the networks 5, 6, 7 and 8 with respect to line impedance, line length and the coupling of lines influence the resulting pulse width and pulse amplitude. Since the design and function of the networks 5, 6, 7 and 8 shown in FIGS. 3a through 3d are evident to those skilled in the art without further explanations, a detailed description is not included here. It should only be pointed out that the networks 5, 6 and 8 have planar structures with lines that are partially short-circuited against the signal ground, while this feature is not provided in network 7.

Apart from the planar structures 5, 6, 7 and 8 shown in FIGS. 3a to 3d also transformer circuits 9 and 10 are suited as differentiation circuits or steps 3, as illustrated in FIGS. 4a and 4b, wherein a counterwound transformer circuit leads to polarity reversal.

Moreover the differentiation circuit or devices 3 can be designed at the same time as directional couplers or as duplexers for certain applications. The two pulses generated by the differentiation of the output signal coming from the transistor device 2 exhibit apart from different polarity also different amplitudes, which can be attributed to the different gradients of the switch-on side and/or switch-off side of the output signal of the transistor circuit or device 2.

By means of the respective clipping device 4, e.g., an individual pulse can be extracted from the primary pulses emitted by the differentiation circuit or devices 3. Pursuant to a preferred embodiment of the invention, the clipping device 4 is implemented as a Schottky diode, which is added serially into the line, which clips the corresponding pulse in accordance with the selected polarity. When selecting the Schottky diode, attention should be paid, among other things, to a very low case capacitance in order to prevent capacitive cross-talk of the clipped pulse. Also different variations are suited as clipping devices 4, which are based on the fast HF transistors or rapid HF-suitable diodes and are inserted either serially or in parallel into the output line of the differentiation circuit or device 3.

Finally, as illustrated in the preferred embodiment of the invention shown in FIG. 5, it is also provided to interlink several differentiation devices 3 and clipping devices 4, i.e. to provide a plurality of differentiation circuits or devices 3 separated by a clipping device 4, respectively. Such interlinking of several differentiation circuits or devices 3 and clipping devices 4 leads to a decrease in the pulse width due to multiple differentiation of the pulse signal. Due to the clipping devices 4 which generally have a passive design, however, such a recurrent network also leads to a decrease in the pulse amplitude.

The pulses created with the present invention are generally fed to a line, such as a microstrip or a coaxial system with a defined characteristic impedance. Accordingly, the output impedance should be adjusted to the characteristic impedance of the line. In relation to a 50 ohm system, pulse widths of below 90 ps and amplitudes of several volts can be achieved.

In relation to a voltage amplitude of, for example 5V, a 50 ohm system results in a current of 100 mA and hence an instantaneous power of 500 mW. Compared to conventional pulse generation by means of step recovery diodes, which require a control signal that corresponds to the output power, the control power of the pulse generator described in the present invention is lower several times over so that it is, e.g., possible to control several pulse generators in parallel by means of a TTL signal.

What is claimed is:

1. A method for generating short electric pulses, comprising the steps of generating as a transistor input signal a control pulse, feeding the control pulse to a bipolar transistor which is operated in a common emitter circuit and which subsequently emits an output signal exploiting the charge storage effect of the bipolar transistor by initially directing the bipolar transistor briefly into a state of saturation so that both the base emitter diode and the base collector diode become conductive and so that the base collector space charge region is flooded with minority carriers becoming of low impedance, shutting off the control pulse after a brief period of delay so that the base collector space charge region abruptly becomes high-impedance leading to an abrupt increase in the collector voltage and to an output signal the switch-offside of which is clearly steeper compared to the transistor input signal, and differentiating the output signal with the steep switch-off side so that short primary pulses are generated.

2. The method according to claim 1, including the step of removing predetermined pulse parts from the short primary pulses so that a short pulse signal is generated.

3. The method according to claim 2, wherein to further shorten said short pulses signal a plurality of differentiation steps are performed, wherein between two successive differentiations a predetermined part is removed from the short pulse signal.

4. The method according to claim 1 or 2, including the step of using a rectangular pulse having a pulse width of several nanoseconds as the control pulse.

5. The method according to claim 1 or 2, including the step of using an heterostructure bipolar transistor as the bipolar transistor.

6. A method for generating short electric pulses, comprising the steps of generating a control pulse, feeding the control pulse to a bipolar transistor, which subsequently emits an output signal exploiting the charge storage effect of the bipolar transistor by initially directing the bipolar transistor briefly into a state of saturation which leads to a steep switch-off side of the transistor output signal, and differentiating the output signal with the steep switch-off side so that short primary pulses are generated.

7. The method according to claim 6, including the step of operating the bipolar transistor in a common emitter circuit.

8. The method according to claim 6 or 7, including the step of removing predetermined pulse parts from the short primary pulses so that a short pulse signal is generated.

9. The method according to claim 8, wherein to further shorten said short pulse signal a plurality of differentiation steps are preformed, wherein between two successive differentiations a predetermined part is removed from the short pulse signal.

10. The method according to claim 6 or 7, including the step of using a rectangular pulse having a pulse width of several nanoseconds as the control pulse.

11. The method according to claim 6 or 7, including the step of using a heterostructure bipolar transistor as the bipolar transistor.

* * * * *